July 15, 1969 A. SCHULZ 3,456,197
CIRCUIT ARRANGEMENTS FOR AUTOMATIC SIGNAL-SEEKING
Filed Jan. 28, 1966
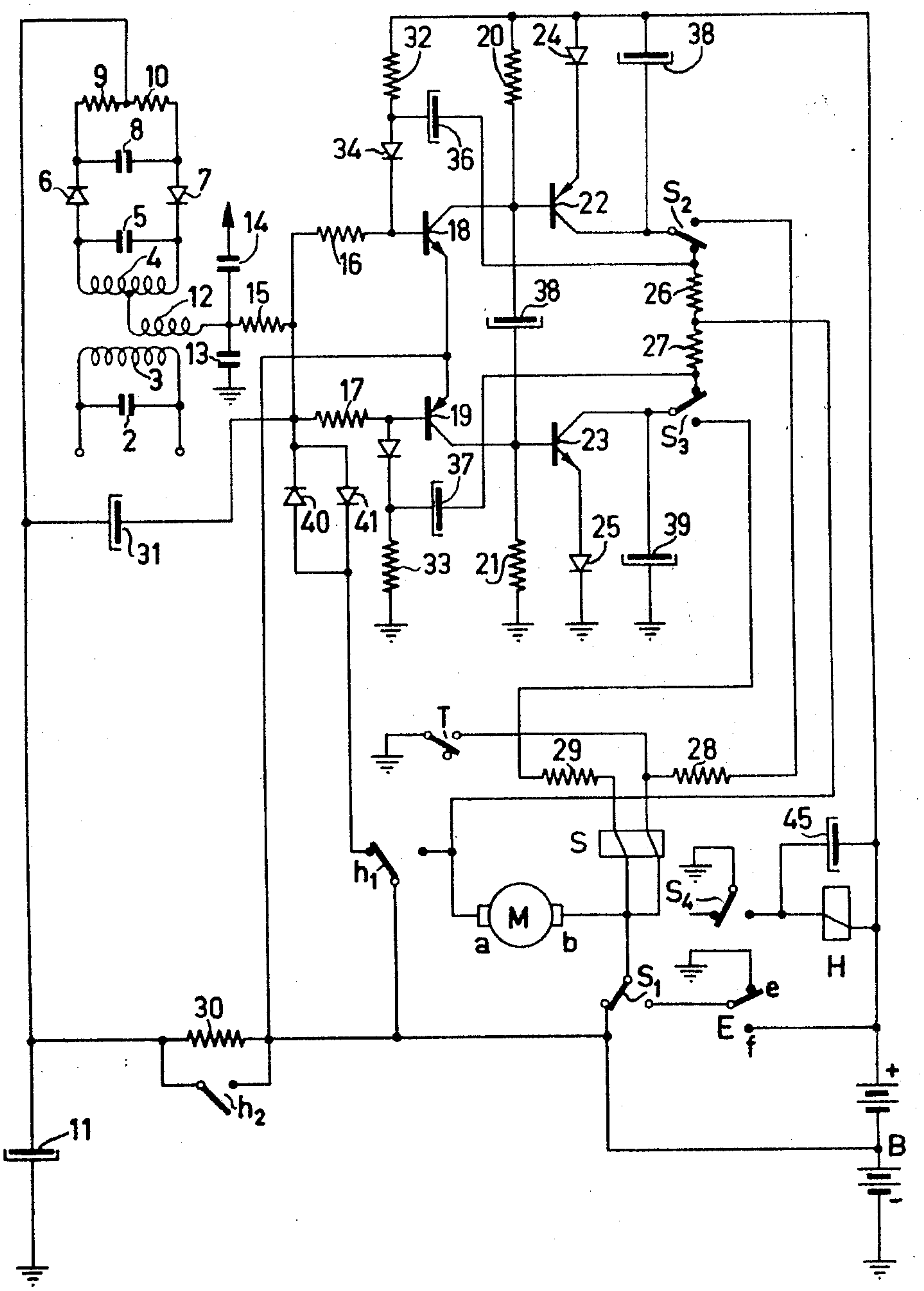
INVENTOR.
ALFRED SCHULZ
BY [signature]
AGENT United States Patent Office 3,456,197

Patented July 15, 1969

3,456,197
CIRCUIT ARRANGEMENTS FOR AUTOMATIC SIGNAL-SEEKING

Alfred Schulz, Wetzlar, Germany, assignor, by mesne assignments, to U.S. Philips Corporation, New York, N.Y., a corporation of Delaware Filed Jan. 28, 1966, Ser. No. 523,671
Claims priority, application Germany, Jan. 28, 1965, P 35,954; Dec. 18, 1965, P 38,376
Int. Cl. H04b 1/32
U.S. Cl. 325—471 4 Claims

ABSTRACT OF THE DISCLOSURE

An automatic tuning process for a radio receiver having a motor driven tuning capacitor to quickly tune across a band. When a discriminator component registers an output from a carrier wave a series of pulses are generated and coupled to the motor and slowly rotates it until the discriminator output is nearly zero at which point the receiver becomes tuned to the carrier wave.

The invention relates to a circuit arrangement for the automatic signal-seeking, in which a tuning-driving device, for example, a motor, is stopped by the output signal (detuning quantity) of a discriminator when the tuning adjustment approaches the nominal value of the frequency of the transmitter to be received.

It is known to supply the signal oscillation occurring during the tuning to a selective resonant circuit, preferably through amplifiers, and to effect the stopping when the voltage at the resonant circuit exceeds a given value. Since the mechanical driving device has a definite inertia, the danger exists that the tuning adjustment passes the desired nominal value of the tuning to a desired transmitter to such an extent that the correct tuning adjustment is not obtained and that it is even possible that there is tuned to an adjacent transmitter. In fact, such a resonant circuit supplies the maximum voltage at its tuning frequency and since stopping occurs when the voltage at the resonant circuit exceeds a given limiting value it appears that, although in the case of a strong transmitter the said voltage is reached in time and the switching off of the driving device is effected in time so that in its rest condition it is as near as possible to its nominal value; it may occur in the case of a weak transmitter that the switching off occurs only when the correct adjustment is reached and the driving device in that case continues driving to a considerable extent owing to its inertia, thus varying the tuning up to a value at which even an automatic fine-tuning can no longer effect the correct adjustment to the desired transmitter.

To avoid this the stopping of the motor can be effected by an instantaneous braking, for example, by a lock pawl actuated electromagnetically and cooperating with a toothed wheel. Alternatively it is possible when the nominal value is approached to reduce the speed of the driving device considerably or to switch the motor temporarily, for example, with pulses, to the opposite direction of running.

Such arrangements are comparatively expenisive in particular since they require comparatively precise mechanical actions on the driving device.

In known devices employing a discriminator which also controls the automatic fine-tuning, a timely switching off is difficult since, when a transmitter is approached, a constantly active fine-tuning arrangement tries to control the tuning-driving device first in the direction of signal-seeking so that a switching-off of the signal-seeking cannot become operative timely before the nominal adjustment and often even only after exceeding the nominal value; in this case, however, the danger that the driving device is moved beyond the range of the automatic fine-tuning as a result of its inertia is particularly large.

In a circuit arrangement of the type described in the preamble said drawbacks are avoided and, while using a discriminator which supplies a considerable detuning quantity already before the nominal value, a timely switching off of the driving device and a stoppage near to the nominal value, while taking into account the inertia of the driving device, can be reached if, according to the invention, a relay arrangement (seeking relay) serves for switching off the signal-seeking which arrangement connects the discriminator, switched off during the signal seeking from the fine-tuning arrangement, to the driving device and makes it operative for fine-tuning. Preferably, a discriminator is used which has an approximately S-shaped characteristic with two humps of opposite polarities and the output signal of the discriminator switches off the seeking, preferably through the relay arrangement, when the frequency has approximately reached the range of the hump lying before the nominal value.

In order that the invention may readily be carried into effect, it will now be described in greater detail, by way of example, with reference to the accompanying drawing which shows the relay arrangement and a driving motor together with an amplifier circuit arrangement with which a fine-tuning motor also in the case of very low detuning can be controlled very exactly so that an accurate fine-tuning can be obtained through mechanical members.

In a receiver the oscillations to be received are applied to a frequency discriminator in which, preferably by superposition with the oscillations of an oscillator, an intermediate frequency of for example, 10.7 mc./s. is formed which has the same nominal value for all adjustable transmitters. These oscillations are applied to a resonant circuit consisting of the capacitor 2 and the inductor 3 which is coupled to an inductor 4 tuned by means of a capacitor 5. Through the bandfilter thus formed, the oscillations received are applied to opposite electrodes of diodes 6 and 7, the other electrodes of which are connected together through a charge-capacitor 8 of, for example, 5 $\mu$f. and the series arrangement of two resistors 9 and 10 of, for example, 15K ohm each. The junction of the resistors 9 and 10 is connected to earth through a capacitor 11 of, for example, 100 $\mu$f. A tap, preferably the centre tap, of the inductor 4 is connected to earth through a tertiary coil 12 rigidly connected to the inductor 3 at one end through a capacitor 13 of, for example, 470 pf., shortcircuiting the carrier oscillations (IF) and at the other end the demodulated low-frequency oscillations can be derived through a coupling capacitor 14 of, for example 0.1 $\mu$f. Thus far, the circuit arrangement constitutes a known ratio detector.

A control direct voltage depending upon the detuning with respect to the nominal value approximately in the centre of the discriminator curve further occurs at the tertiary winding 12. Said voltage is applied, through decoupling resistors 15, 16 and 17 of 4.7K ohm each to the base input electrodes of an npn-transistor 18 and a pnp-transistor 19. The emitter electrodes of the transistors 18 and 19 are connected to the centre of the supply battery B the negative pole of which is connected to earth. The collectors of the transistors 18 and 19 are connected through resistors 20 and 21 of 1K ohm each to the positive and negative terminals respectively of the battery B and to the base-control electrodes of the pnp-transistor 22 and the npn-transistor 23 of the amplifier output stage. The emitter electrodes of the transistors 22 and 23 are connected, through diodes 24 and 25 respectively passing the emitter current and having an internal threshold value of approximately 0.2 volt, to the positive and negative pole respectively of the supply source.

According to the invention, for switching on and off a motor M serving as a tuning-driving device, a relay arrangement is provided which comprises a seeking relay S which is constructed as a current pulse relay (bistable relay) which is brought in one or in the other condition, hereinafter denoted by I and II respectively, by a pulsatory current in accordance with the polarities thereof. The condition I corresponds to the condition in which the motor serves for fine-tuning and in the condition II the automatic signal seeking occurs.

The collector electrodes of the transistors 22 and 23 are connected to switching contacts *s2* and *s3* respectively of the signal seeking relay S the opposite contacts of which connected into circuit in the condition I are connected, through compensating resistors 26 and 27 respectively of 1 ohm each, to one terminal *a* of the winding of the motor M. The contacts of the switches $s_2$ and $s_3$ operative in the condition II are connected, through compensating resistors 28 and 29 respectively of 5 ohms each, to a winding of the seeking relay S which is operative in the opposite direction with respect to the others; the other ends of these windings are connected to the switching contact *s1* of the seeking relay S with the other terminal *b* of the motor M which contact in the condition I makes a connection to the centre of the supply voltage battery B, the negative pole of which is connected to earth. The junction of the resistors 9 and 10 of the ratio detector is connected to the centre of the battery B through a resistor 30 of 100 ohm. The ratio detector circuit is locked for alternating currents by a capacitor 31 of 10 μf. between the junction of the resistors 15, 16 and 17 and the junction of the resistors 9 and 10, and it is prevented that the current pulses from the motor circuit reach the low frequency channel.

The base electrodes of the transistors 18 and 19 are connected through high-value resistors 32 and 33 respectively of, for example, 470K ohm, to the associated collector supply point; as a result of this the transistors are adjusted to low currents in particular when the tuning is at least approximately correct (small detuning). The diodes 34 and 35 connected between the resistors 32 and 33 and the base electrodes are made conductive by the base current and consequently are of no essential influence for the operating point adjustment.

In the fine-tuning arrangement (condition I) shown the discriminator circuit with the ratio detector supplies a detuning quantity, depending upon the detuning between the discriminator nominal value and the applied oscillatory frequency, as a direct voltage value through the resistors 15, 16 and 17 to the base electrodes of the transistors 18 and 19.

Dependent upon the polarity of the said detuning quantity one transistor, for example transistor 18 in the case of positive polarity, is made conductive and the other transistor (for example, 19) is cut off. An amplified detuning quantity then occurs at the collector of the conductive transistor 18 and is applied to the base of the following amplifier transistor 22. Said base is connected through the resistor 20 to the same terminal of the supply source as the diode 24 connected in the emitter branch; so in the rest condition, when substantially no current flows through the resistor 20, it is cut off. The diode 24 with internal threshold value is very high ohmic so that the transistor 22 conveys substantially no current not only as a result of the low input signal, but also owing to an extremely large emitter resistance, so that consequently the tuning motor M also substantially conveys no current. When the detuning increases the transistor 18 becomes more strongly conductive; as a result of this the voltage at the base of the pnp-transistor 22 becomes more negative. However, as long as the base voltage remains below the threshold value voltage of, for example, 0.2 volt, at which the diode 24 assumes a low resistance and better conveys currents, the emitter branch of the transistor 22 remains high ohmic and accordingly the collector current very low. In the case of small detuning, consequently, the diodes operate in the emitter branches of the output transistors 22 and 23 as a threshold arrangement.

Only when the threshold value is exceeded does the emitter branch (24) of the output transistor 22 controlled in the conductive direction become low-ohmic and it conveys a current which rapidly increases when the detuning increases which current flows through the motor M. In particular owing to the static friction the motor could start, however, only in case of a comparatively large detuning.

The amplified detuning quantity occurring at the output of the threshold value arrangement is applied, through a capacitor 36 (and 37 respectively) of 3.2 μf., from the collector of the output transistor 22 (and 23 respectively) to the base of the associated preceding transistor 18 (and 19 respectively). If the threshold value is exceeded a low tuning variation then causes a considerably stronger variation of the collector potential of the output transistor 22 which is then transmitted, through the capacitor 36, in the same operating direction to the base of the preceding transistor 18. The connection to the capacitor 36 operates as a channel with a feedback factor exceeding 1; as a result of this the transistor 22 is rapidly made entirely conductive in one feedback operation so that half the voltage of the battery 20 is set up substantially undiminishedly at the motor M and starts it with full torque.

The capacitor 36, the foil of which connected to the collector of the transistor 22 initially was at the potential of the centre of the battery, is brought to the potential of the positive terminal of the battery B. When the charging of the capacitor is completed, no control current flows any longer out of the feedback circuit to the base of the transistor 18 and the motor M stops again if the detuning quantity applied from the discriminator 1 is insufficient, without additional feedback coupling, to supply a sufficient current to the motor M through the transistor 22. So the feedback coupling is interrupted after a fine-tuning interval determined by the charging time constant of the capacitor 36. If it is assumed that the fine-tuning range is restricted, for example, by the humps of the ratio detector discriminator curve, the duration of a fine-tuning interval determined by a short switching on of the motor and interruption of the feedback coupling must be small as compared with the period required for the maximum fine-tuning by the motor from a maximum detuning value to the nominal value (approximately in the centre of the discriminator curve). As a result of this it is ensured that the motor in a fine-tuning interval does not exceed the nominal value too far as a result of its swing (inertia).

In order that the pulses for running the motor M do not succeed one another too closely and sufficient pauses are formed in which the mechanical parts can become stationary, capacitors 38 and 39 respectively of 2000 μf. each are connected between the collectors of the transistors 22 and 23 and the supply source, in particular the terminal connected to the emitter in question, on which capacitors the amplified detuning quantity is integrated and consequently acts upon the motor only with a certain delay.

The diodes 34 and 35 pass the signal applied through the feedback channel including the capacitors 36 and 37 respectively. If after completion of the fine-tuning interval the output transistor 22 (and 23 respectively) again becomes less current-conducting, the voltage at the capacitor of the output transistor again approaches the voltage of the centre of the battery; said voltage variation would cut off the associated transistor 18 and possibly cause an inadmissibly high base-cut-off voltage. The diode 34 (and 35 respectively) connected in the feedback channel preferably passes the signals operating in the conducting direction but cuts off the signals operating in the opposite direction.

In order to ensure that always only one of the output transistors 22 and 23 respectively is conductive, the base electrodes of the said transistors are connected through a capacitor 38 of 50 μf.; the control pulses operating in the conducting direction and applied to the amplifier transistor operative for one direction of running are consequently made operative in a cut-off sense at the amplifier transistor for the other direction of running.

In the circuit arrangement described thus far with the seeking relay in the condition I, the motor M is connected between the centre of the battery B and the amplifier output between the resistors 26 and 27 and drives the tuning adjustment in the sense of a fine-tuning (automatic fine-tuning) as soon as a positive or negative detuning quantity indicating a mistuning is applied to the amplifier input through the resistor 15.

According to the invention an automatic signal seeking is obtained by means of the seeking relay S. For that purpose by means of a seeking key T a connection is made of one seeking relay winding associated with the upper transistor 22 between earth and the centre of the battery so that the seeking relay S is transferred from the condition I into the condition II and its two windings are connected through the resistors 28 and 29 to the collector outputs of the final amplifier transistors 22 and 23. The other ends of the windings connected to the terminal *b* of the motor M are switched by the switching contact *s*1 from the centre of the battery to the switching contact of the final position switch E which determines the direction of running and each time switches the direction of variation at the end of a range of the reciprocating tuning adjustment. If the final position switch E is in the position *e* shown, a connection is made of the relay windings and of the motor terminal *b* to earth and the corresponding potential is applied, through the relay windings, to the connected output transistors 22 and 23. The transistor 23 then obtains substantially no collector-emitter voltage and is inoperative. In the collector-emitter circuit of the other transistor 22 the full voltage of the battery which consists, for example, of two halves of 4.5 volt each, is operative; however, as long as no signal is received and consequently the ratio detector 1 conveys no voltage, no current flows so that the seeking relay remains in the condition II.

By the contact *s*4 of the seeking relay S a current circuit for an auxiliary relay H is closed which then attracts. By its contact *h*1 the centre of the battery is switched off from a diode arrangement 40, 41 and switched to the motor terminal *a*; as a result the motor M receives voltage between the centre of the battery and the other pole of the battery determined by the final position switch E and consequently runs with maximum torque in one or in the other direction. As a result of the operation of the relay S, namely its contacts *s*2 and *s*3, the discriminator 1 is switched off from the motor M so that the discriminator voltage cannot immediately influence the running of the motor.

As a result of the S-shaped characteristic of the discriminator with two humps of opposite polarities it appears that before the nominal value of the frequency adjustment for a transmitter, so before the passage through zero of the discriminator curve between the two humps, a direct voltage of considerable polarity appears at the output of the discriminator and is applied through the resistors 15, 16 and 17 to the transistors 18 and 19. The circuit arrangement, in particular the polarities, are chosen to be so that the polarity occurring before the nominal position with the direction of running in question determined by the final position switch E renders the transistor 18 and consequently the output transistor 22 conductive. Then its collector current flows, through the resistor 28, through the associated relay winding and in accordance with its current direction, which is opposite to the current direction determined by the seeking key T, effects a switching of the relay S out of the seeking condition II in the fine-tuning condition I. Then the auxiliary relay H also conveys no current and is deenergized with delay in this case by a parallel capacitor 45 of 50 μf. Since the contact *s*1 already switches back before the contact *h*1 has switched with delay, the terminals *a* and *b* of the motor M are short-circuited for a short interval as a result of which the motor is braked.

Any mistuning controls the motor through a detuning quantity from the discriminator 1 through the transistor amplifier for such a period of time until the mistuning is smaller than the response threshold value determined by the diodes 24 and 25 so that then the motor M remains stationary.

In the fine-tuning condition I opposite parallel-arranged diodes 40 and 41 are connected between the junction of the resitsors 15, 16 and 17 at the amplifier input and through the relay *h*1 to the centre of the battery.

These diodes cause the detuning signal applied to the transistor arrangement from the ratio detector 1 to be limited in particular in that the diode associated with the cut-off transistor becomes conductive and more strongly loads the ratio detector output. By these diodes and by the values of the resistors 15, 16 and 17, it can be adjusted in what amplitude range of the detuning quantity the transistor circuit 18, 22 and 19, 23 respectively is made so conductive that the motor runs also without feedback coupling and consequently remains uninterruptedly until the detuning quantity has exceeded the said limiting value.

Thus it could be achieved that at a maximum voltage of 0.5 volt at the winding 12 the voltage at the junction of the resistors 15, 16 and 17 compared with a value of approximately 0.4 volt without the diodes 40 and 41 was reduced to 0.3 volt, and the voltage at the input of the conductive transistor was reduced from 0.2 to 0.15 volt, a current of 0.65 ma. flowing through the two branches with the resistors 16 and 17 of 4.7K ohm each. The said voltage decrease causes the motor to run without a pulse pause only then when the detuning was in the range of a maximum of the discriminator curve.

Since for the switching off of the signal seeking such a limiting of the detuning quantity is not required and, with a view to a rapid stoppage, is perhaps even undesirable, the limiting diodes 40 and 41 are switched off in the seeking condition II by the contact *h*1.

If, in a final position the motor is switched from one half of the battery to the other half of the battery through the switch E, a sudden voltage variation might occur at the centre of the battery by the displacement of the battery load which variation, for example, by the connection with the emitters of the transistors 18 and 19, might make the amplifier conductive for a short period of time and thus stop the signal seeking. By the contact *h*2 of the auxiliary relay H, the series resistor 30 is shunted during the signal seeking, so that the capacitor 11 is connected to the centre of the battery; as a result of this a sudden voltage variation disturbing the operating condition of the amplifier with the transistors 18, 19, 22, 23 is avoided in the final positions.

What is claimed is:

1. A process for automatically tuning a radio receiver to a carrier wave signal comprising;
   - tuning said receiver rapidly with a motor;
   - generating a control signal of a first polarity when said receiver is tuned on one side of said carrier wave, of the opposite polarity when said receiver is tuned on the other side of said carrier wave, and of zero polarity when tuned directly on said carrier wave;
   - pulsing said motor when the absolute value of said control signal exceeds a first threshold value, whereby the receiver will be tuned slowly towards said carrier wave; and stopping said motor when said control signal falls below a second threshold value, whereby said receiver will be tuned to very near said carrier wave signal without overshoot.

2. A process as in claim 1 further comprising braking before pulsing said motor.

3. A process as in claim 2 wherein said braking step comprises short circuiting said motor.

4. A process as in claim 1 wherein said pulsing step comprises amplifying said control signal in one of two amplifiers depending upon the polarity of said control signal; feeding back a portion of the output of the conducting amplifier whereby said pulses are generated and blocking the remaining unconducting amplifier.

References Cited

UNITED STATES PATENTS 3,131,370 4/1964 Hahnel ---------- 325—471 XR

KATHLEEN H. CLAFFY, Primary Examiner

BARRY PAUL SMITH, Assistant Examiner

U.S. Cl. X.R.

325—470

PO-1050
(5/69)

UNITED STATES PATENT OFFICE

CERTIFICATE OF CORRECTION

Patent No. 3,456,197 Dated July 15, 1969

Inventor(s) ALFRED SCHULZ

It is certified that error appears in the above-identified patent and that said Letters Patent are hereby corrected as shown below:

Column 3, line 25, after "S" insert -- together --;

Signed and sealed this 25th day August 1970.

(SEAL)
Attest:

Edward M. Fletcher, Jr.
Attesting Officer

WILLIAM E. SCHUYLER, JR.
Commissioner of Patents